United States Patent
Cassia et al.

(10) Patent No.: US 8,150,339 B2
(45) Date of Patent: Apr. 3, 2012

(54) SWITCHABLE-LEVEL VOLTAGE SUPPLIES FOR MULTIMODE COMMUNICATIONS

(75) Inventors: Marco Cassia, San Diego, CA (US); Aristotele Hadjichristos, Cary, NC (US)

(73) Assignee: QUALCOMM, Incorporated, San Diego, CA (US)

(*) Notice: Subject to any disclaimer, the term of this patent is extended or adjusted under 35 U.S.C. 154(b) by 777 days.

(21) Appl. No.: 11/935,200

(22) Filed: Nov. 5, 2007

(65) Prior Publication Data

US 2009/0117864 A1    May 7, 2009

(51) Int. Cl.
*H04B 1/04* (2006.01)
*H04M 1/00* (2006.01)

(52) U.S. Cl. .................. 455/127.1; 455/118; 455/550.1

(58) Field of Classification Search .............. 455/550.1, 455/552.1, 553.1, 126, 127.1, 127.2, 127.3, 455/127.4, 115.1, 127.5, 118; 330/282, 285, 330/297
See application file for complete search history.

(56) References Cited

U.S. PATENT DOCUMENTS

| | | | |
|---|---|---|---|
| 5,423,078 A | 6/1995 | Epperson et al. | |
| 5,546,051 A | 8/1996 | Koizumi et al. | |
| 5,774,813 A * | 6/1998 | Jokinen | 455/574 |
| 5,999,829 A | 12/1999 | Chun et al. | |
| 6,137,355 A | 10/2000 | Sevic et al. | |
| 6,819,941 B2 | 11/2004 | Dening et al. | |
| 2002/0146993 A1* | 10/2002 | Persico et al. | 455/126 |
| 2004/0108901 A1* | 6/2004 | Apel et al. | 330/285 |
| 2004/0246050 A1 | 12/2004 | Kikuchi | |
| 2007/0223615 A1 | 9/2007 | Dosanjh et al. | |
| 2007/0270111 A1* | 11/2007 | Pan | 455/127.1 |
| 2008/0057883 A1* | 3/2008 | Pan | 455/127.1 |

FOREIGN PATENT DOCUMENTS

| | | |
|---|---|---|
| EP | 0673112 A1 | 9/1995 |
| EP | 1768269 A1 | 3/2007 |
| JP | 6507775 T | 9/1994 |
| JP | 7250017 A | 9/1995 |
| JP | 9501300 T | 2/1997 |
| JP | 2003258563 A | 9/2003 |
| JP | 2004500730 A | 1/2004 |
| JP | 2004363867 A | 12/2004 |
| JP | 2005020476 A | 1/2005 |
| WO | WO9318583 A1 | 9/1993 |
| WO | WO9318590 A1 | 9/1993 |
| WO | WO9534121 A1 | 12/1995 |
| WO | WO9963676 A1 | 12/1999 |
| WO | WO0217478 A1 | 2/2002 |
| WO | WO2007018598 A1 | 2/2007 |
| WO | WO2007033264 | 3/2007 |

OTHER PUBLICATIONS

International Search Report and Written Opinion—PCT/US2008/082507, International Search Authority—European Patent Office—Jan. 1, 2009.

* cited by examiner

*Primary Examiner* — Sonny Trinh
(74) *Attorney, Agent, or Firm* — Larry J. Moskowitz; William M. Hooks (57) ABSTRACT

Switchable voltage level supplies for circuitry in a multimode communications chipset are disclosed. In an embodiment, a first voltage level is supplied to TX circuitry operating in a first mode having a first set of linearity and/or noise requirements. A second voltage level lower than the first voltage level is supplied to TX circuitry operating in a second mode having a second set of linearity and/or noise requirements looser than the first set of requirements. The first mode may be operation according to the GSM standard, and the second mode may be operation according to the W-CDMA standard.

23 Claims, 7 Drawing Sheets

SWITCHABLE-LEVEL VOLTAGE SUPPLIES FOR MULTIMODE COMMUNICATIONS

TECHNICAL FIELD

The disclosure relates to multimode chipsets and, in particular, to voltage supplies powering multimode chipsets.

BACKGROUND

Modern communications devices may support a plurality of communications standards. For example, a "multi-mode" cellular phone may support a plurality of wireless cellular standards, including GSM and W-CDMA. Although the same circuitry may be shared among multiple modes, the requirements on the circuitry may be different depending on the mode and/or system planning. For example, operation in one mode may demand higher linearity from the transmit (TX) circuitry than operation in another mode. One parameter affecting the linearity of TX circuitry is the level of the voltage supply.

In typical multimode designs, the circuitry is supplied with the highest necessary voltage level for all modes of operation, potentially leading to inefficiently high power consumption for one or more of the modes. It would be desirable to dynamically adjust the voltage supplied to the circuitry or to selected blocks within the circuitry depending on the operating mode.

SUMMARY

An aspect of the present disclosure provides an apparatus for supplying a voltage to a transmitter circuit, the circuit processing a signal for transmission over a communications channel, the transmitter circuit comprising a mixer for translating a signal to a higher frequency, the transmitter circuit further comprising an amplifier, the apparatus comprising a voltage generation module for generating a supply voltage for the transmitter circuit, the supply voltage being at a first level during a first phase, and a second level during a second phase, the first level being higher than the second level.

Another aspect of the present disclosure provides a method for supplying a voltage to a transmitter circuit for processing a signal for transmission over a communications channel, the transmitter circuit comprising a mixer for translating a signal to a higher frequency, the transmitter circuit further comprising an amplifier, the method comprising generating a supply voltage for the transmitter circuit, the supply voltage being at a first level during a first phase, and a second level during a second phase, the first level being higher than the second level.

Yet another aspect of the present disclosure provides an apparatus for supplying a voltage to a transmitter circuit for processing a signal for transmission over a communications channel, the transmitter circuit comprising a mixer for translating a signal to a higher frequency, the transmitter circuit further comprising an amplifier, the apparatus comprising means for generating a switchable supply voltage for the transmitter circuit.

DETAILED DESCRIPTION

Disclosed herein are techniques to allow selection of the voltage level or levels supplied to one or more blocks in a circuit depending on the mode of operation.

Figure 1:
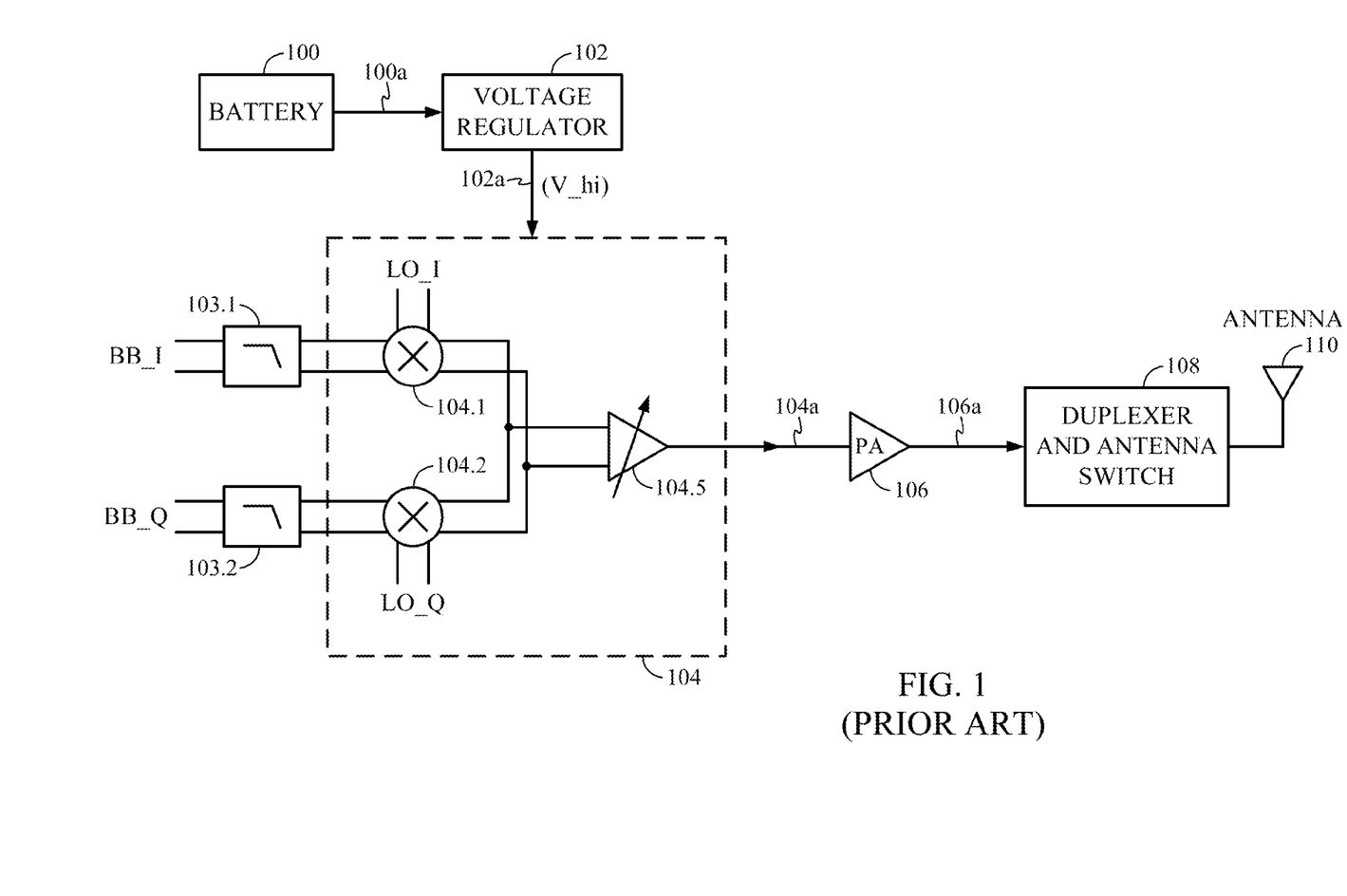
FIG. 1 shows a block diagram of a conventional voltage supply scheme for multi-mode TX circuitry.

FIG. 1 shows a block diagram of a conventional voltage supply scheme for multi-mode TX circuitry. In FIG. 1, a battery 100 provides an unregulated voltage 100a to voltage regulator 102. Voltage regulator 102 provides a regulated voltage 102a to quadrature modulators/VGA (variable gain amplifier) block 104. The quadrature modulators include mixers 104.1 and 104.2, which accept baseband input signals BB_I (in-phase) and BB_Q (quadrature-phase) filtered by low-pass filters 103.1 and 103.2. The mixers 104.1 and 104.2 modulate the baseband signals to a higher frequency by multiplying with local oscillator signals LO_I and LO_Q. The converted signals are input to a variable-gain amplifier (VGA) 104.5 to generate a modulated, amplified signal 104a.

Signal 104a is provided to power amplifier (PA) 106. The output signal 106a of the PA 106 is then provided to duplexer and antenna switch 108, which is coupled to an antenna 110.

In FIG. 1, the voltage regulator 102 provides a voltage level of V_hi to the modulator/VGA block 104 regardless of the operating mode of the TX circuitry. V_hi is typically chosen to be the supply voltage required for the operating mode having the most demanding linearity and/or spectral purity requirements. When operating in a mode having less demanding linearity and/or spectral purity requirements, V_hi will typically be higher than required for that mode, and thus power may be wasted.

Figure 2:
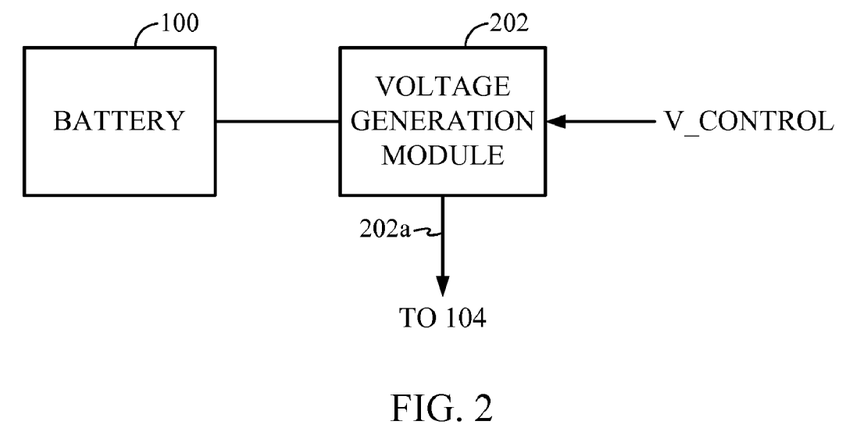
FIG. 2 shows an embodiment of the present disclosure wherein a voltage generation module 202 having a switchable output voltage level is provided to the modulator/VGA block 104.

FIG. 2 shows an embodiment of the present disclosure wherein a voltage generation module 202 having a switchable output voltage level provides the supply voltage 202a to the modulator/VGA block 104.

In the embodiment shown in FIG. 2, the voltage 202a provided to the mixers and/or the VGA within block 104 can be switched between two levels, V_hi and V_lo, depending on a control signal V_control. In an embodiment, V_control instructs the voltage generation module to output V_hi when the operating mode is GSM, and to output V_lo when the operating mode is W-CDMA. In an embodiment, V_hi is 2.7 Volts, and V_lo is 2.1 Volts.

Note that the present disclosure need not be limited to embodiments supporting dual-mode GSM and W-CDMA. Circuitry supporting any other mode, and any number of modes, may readily be accommodated, e.g., circuitry supporting cdma2000 1x, TD-CDMA, etc. Modifications to the present disclosure to accommodate such circuitry will be clear to one of ordinary skill in the art, and are contemplated to be within the scope of the present disclosure.

In an embodiment, the modulator (mixers 104.1 and 104.2) and the VGA 104.5 are each provided with their own connections to the supply voltage 202a. The switchable output voltage 202a may be provided to both the modulator (mixers 104.1 and 104.2) and the VGA 104.5, or to one of the modulator and the VGA. In an alternative embodiment, to be described later with reference to FIG. 4, the modulator and VGA may have a "stacked" topology, and both may be powered by a single connection to the switchable supply voltage 202a through the VGA.

Note that the switchable output voltage 202a of the voltage generation module 202 may in general be supplied to any component block within the TX circuitry. In some embodiments, the switchable output voltage 202a may be supplied to those component blocks that directly affect the linearity of the TX signal path. As shown in FIG. 2, the switchable voltage may be supplied to the frequency modulator (or mixer), and/or the variable gain amplifier (VGA). In alternative embodiments (not shown), the switchable voltage may supply the driver amplifier (not shown).

Figure 2A:
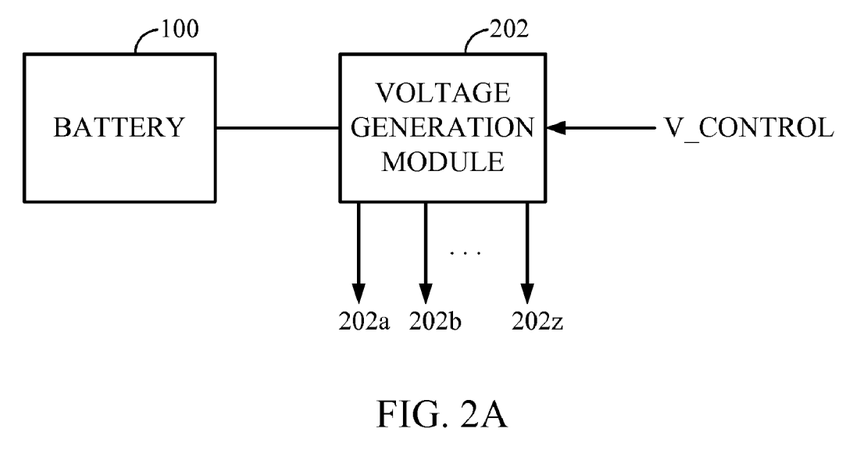
FIG. 2A shows an embodiment wherein a plurality of switchable output voltages 202a, 202b, ..., 202z may be separately provided to individual blocks within the TX circuitry.

FIG. 2A shows an embodiment wherein a plurality of switchable output voltages 202a, 202b, . . . , 202z may be separately provided to individual blocks within the TX circuitry. In this way, the specific output voltage level provided to each block (or to any block) within the TX circuitry may be custom configured. For example, a first switchable voltage level V1/V0 may be provided via output voltage 202a to a mixer block within the TX circuitry, while a second switchable voltage level V2/V0 may be provided via output voltage 202b to the VGA block, etc. For ease of description in this disclosure, reference may be made to embodiments having only one switchable output voltage 202a. However, it is contemplated that such embodiments may readily be modified to incorporate multiple switchable output voltages as shown in FIG. 2A.

Note that V_control may be an analog signal or a digital signal. The specification of the appropriate output voltage level to the voltage generation module 202 may be done in a number of ways. For example, V_control may be a simple logical high or low signal, which the voltage generation module 202 may decode as corresponding to a preset value V_hi or V_lo. Alternatively, V_control may specify the actual voltage level to be output by the regulator, either as an analog voltage level or as a set of digital bits corresponding to a predefined resolution. These embodiments and others will be clear to one of ordinary skill in the art, and are contemplated to be within the scope of the present disclosure.

As described previously, the setting of V_control may depend on the operating mode of the circuitry, e.g., whether the circuitry is operating in GSM mode or in W-CDMA mode. The signal may be generated by software or firmware running on the multimode device, or located separately from the multimode device. For devices supporting more than two modes, V_control can be correspondingly modified to signal the appropriate mode-dependent output voltage level to the voltage generation module 202.

Note according to the present disclosure, V_control need not depend only on the operating mode of the circuitry. In an embodiment, V_control can configure voltage generation module 202 to output a higher or lower voltage whenever such a voltage is deemed advantageous to operation. Any selection of the supply voltage level for a given circuitry block based on any criteria is contemplated to be within the scope of the present disclosure.

Figure 3:
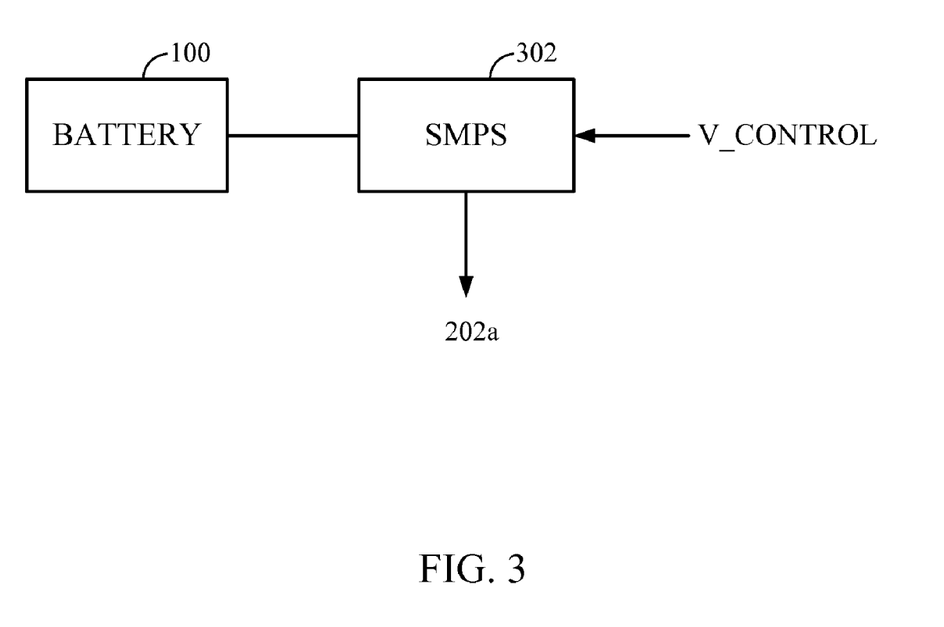
FIG. 3 shows an embodiment wherein the voltage generation module 202 is implemented as a switched-mode power supply (SMPS, or switched-mode voltage regulator).

FIG. 3 shows an embodiment wherein the voltage generation module 202 is implemented as a switched-mode power supply (SMPS, or switched-mode voltage regulator), and the output voltage 202a of the SMPS may be controlled by varying the duty cycle of the switching within the regulator. In an embodiment, the SMPS is a buck converter designed to step a high DC voltage down to a low DC voltage. The design of SMPS's and buck converters is well known in the art, and will not be described further herein.

Figure 3A:
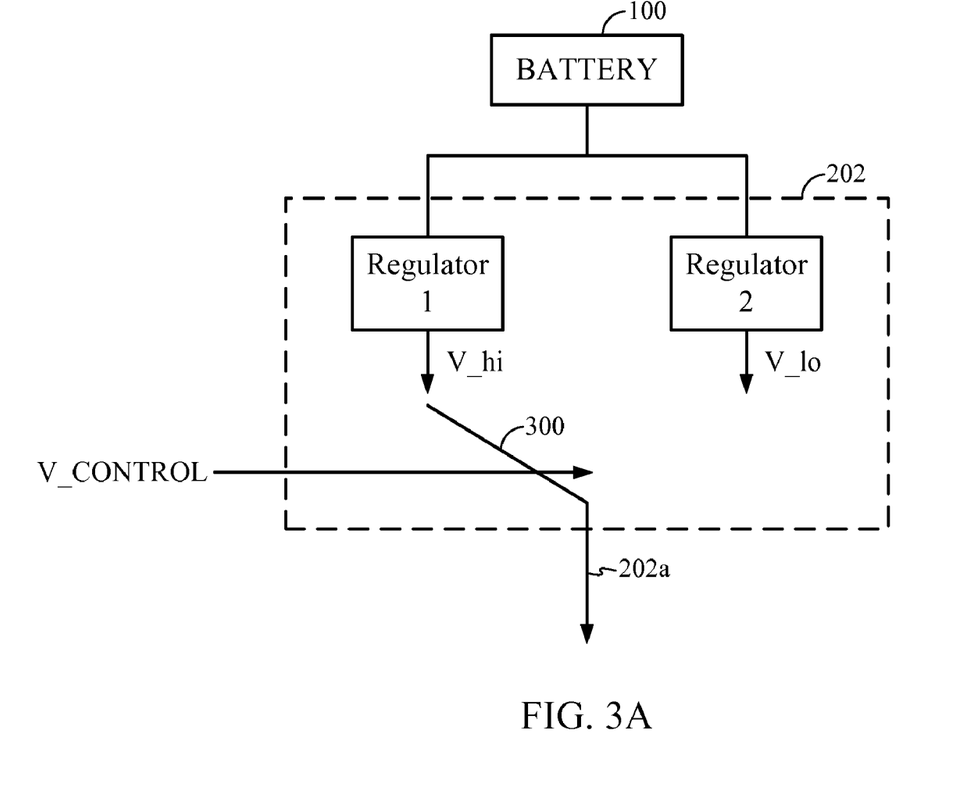
FIG. 3A depicts an alternative embodiment of voltage generation module 202 that includes a switch for switching between two output voltage levels, each voltage level being generated by a separate power supply or voltage regulator.

FIG. 3A depicts an alternative embodiment of voltage generation module 202 that includes a switch for switching between two output voltage levels, each voltage level being generated by a separate power supply or voltage regulator. Whereas the embodiment of FIG. 3 depicts a single voltage generation module 302 generating two different output voltage levels based on a signal V_control, the embodiment of FIG. 3A shows two voltage regulators Regulator1 and Regulator2 each generating a single output voltage level, the actual output voltage 202a being selected from between the two voltage regulator outputs by switch 300. Switch 300 may be controlled by the signal V_control.

Note the embodiments depicted in FIGS. 3 and 3A may be readily modified to accommodate more than two output voltage levels, to provide appropriate voltage levels to circuitry supporting more than two operating modes. Such modifications will be clear to one of ordinary skill in the art, and are contemplated to be within the scope of the present disclosure. In such embodiments, V_control may be configured to signal to the voltage generation module 202 which of the multiple voltage levels are to be provided as output voltage 202a.

Figure 4:
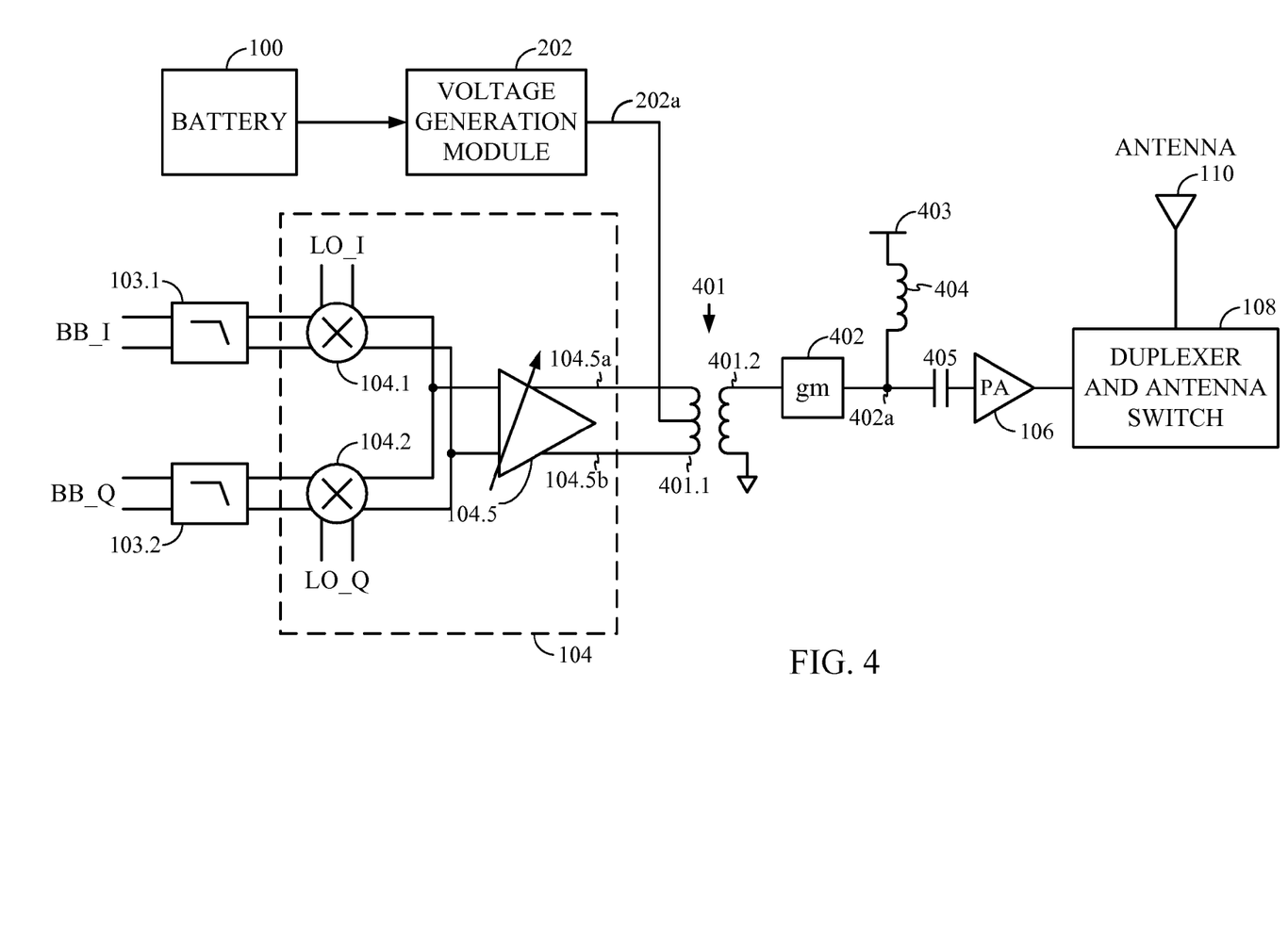
FIG. 4 depicts an embodiment wherein the mixers 104.1 and 104.2 and the VGA 104.5 are implemented using a "stacked" topology, and wherein a single voltage rail supplied to the VGA 104.5 powers the VGA 104.5 along with the mixers 104.1 and 104.2.
Figure 5:
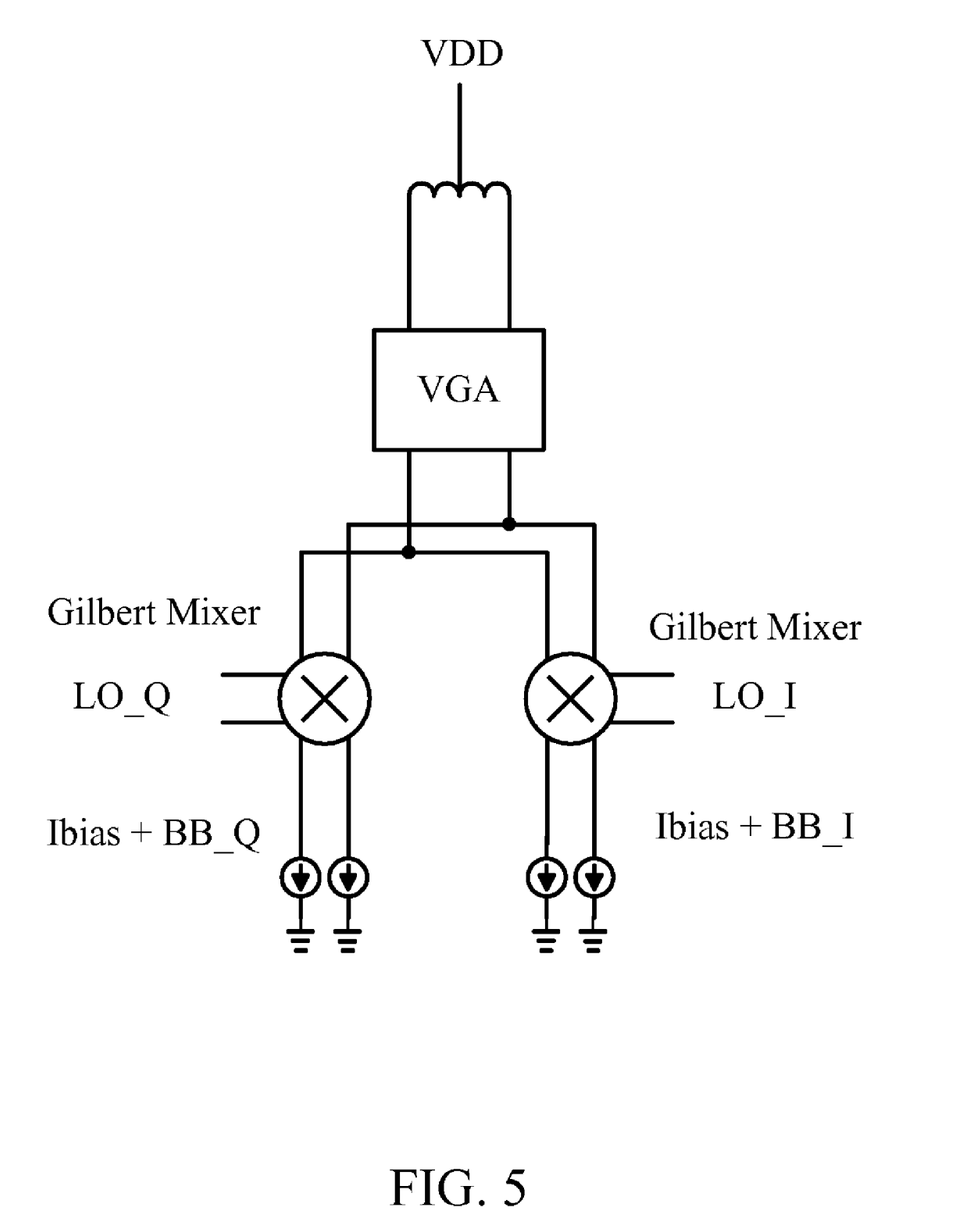
FIG. 5 shows a possible implementation of a stacked VGA/mixer topology.

FIG. 4 depicts an embodiment wherein the mixers 104.1 and 104.2 and the VGA 104.5 are implemented using a "stacked" topology, and wherein a single voltage rail supplied to the VGA 104.5 powers the VGA 104.5 along with the mixers 104.1 and 104.2. FIG. 5 shows a possible implementation of a stacked VGA/mixer topology. In FIG. 5, two Gilbert mixers are provided to mix a baseband in-phase signal (BB_I) with an in-phase local oscillator signal (LO_I), and a baseband quadrature-phase signal (BB_Q) with a quadrature-phase local oscillator signal (LO_Q). Note the implementation of FIG. 5 is provided only as an illustration, and is not meant to limit the disclosure to the specific topology shown. One of ordinary skill in the art will recognize that the VGA and mixers may be implemented in a number of different ways not explicitly described herein.

Referring back to FIG. 4, the differential output voltage of the VGA 104.5 is defined by the two voltages 104.5a and 104.5b, which are both DC-coupled to the switchable supply voltage 202a. VGA 104.5 drives transformer 401 whose output is coupled to transconductance amplifier 402. Transconductance (gm) amplifier 402 converts the voltage across the secondary side 401.2 of the transformer 401 to a current output. Inductance 404, which is coupled to a DC bias/supply rail 403, allows the voltage swing at 402a to go above the supply rail 403. Capacitor 405 couples the AC voltage at 402a to the power amplifier 106. The signal is then supplied to the duplexer and antenna switch 108, and to the antenna 110.

In an embodiment (not shown), the DC bias/supply rail 403 is coupled to the switchable supply voltage 202a.

Figure 6:
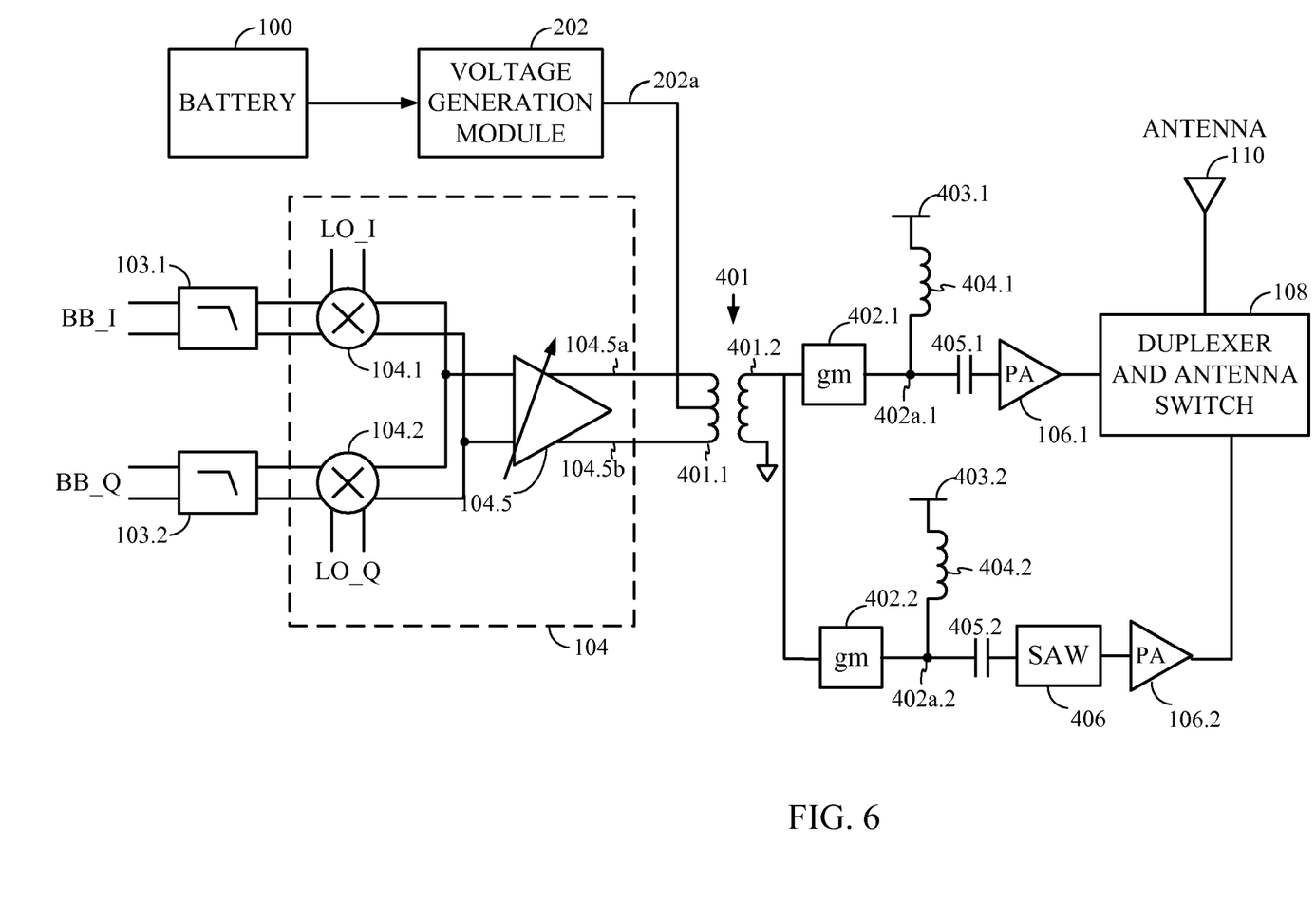
FIG. 6 depicts an alternative embodiment of the present disclosure, wherein two signal paths are provided from the secondary side 401.2 of transformer 401 to the duplexer and antenna switch 108.

FIG. 6 depicts an alternative embodiment of the present disclosure, wherein two signal paths are provided from the secondary side 401.2 of transformer 401 to the duplexer and antenna switch 108. In FIG. 6, the upper signal path, including elements 402.1, 403.1, 404.1, 405.1, 106.1, is used for signal transmissions during a first mode. The lower signal path, including elements 402.2, 403.2, 404.2, 405.2, 406, 106.2, is used for signal transmissions during a second mode. In an embodiment, the appropriate signal path may be selected by simply powering on one or more of the elements corresponding to the desired signal path, and powering off one or more of the elements corresponding to the other signal path.

The lower signal path is provided with a surface acoustic wave (SAW) filter 406, which removes out-of-channel emissions from the signal to be transmitted prior to amplification by the power amplifier 106.2. The SAW filter 406 thus allows the noise and/or spectral purity requirements of the rest of the circuitry to be relaxed during the second mode. In accordance with the present disclosure, a lower supply voltage may be supplied to any or all blocks of the TX circuitry during operation in the second mode. In an embodiment, the first mode corresponds to a GSM mode, while the second mode corresponds to a W-CDMA mode.

In an embodiment, the supply voltages 403.1 and 403.2 may also be coupled to the switchable supply voltage according to the present disclosure.

Note the provision of SAW filtering during one of the modes of operation may be done according to other embodiments not shown. For example, a switch may be used to bypass a SAW filter placed between capacitors 405.1 and the PA 106.1 for operation during a first mode. Such modifications will be clear to one of ordinary skill in the art, and are contemplated to be within the scope of the present disclosure.

Based on the teachings described herein, it should be apparent that an aspect disclosed herein may be implemented independently of any other aspects and that two or more of these aspects may be combined in various ways. The techniques described herein may be implemented in hardware, software, firmware, or any combination thereof. If implemented in hardware, the techniques may be realized using digital hardware, analog hardware or a combination thereof. If implemented in software, the techniques may be realized at least in part by a computer-program product that includes a computer readable medium on which one or more instructions or code is stored.

By way of example, and not limitation, such computer-readable media can comprise RAM, such as synchronous dynamic random access memory (SDRAM), read-only memory (ROM), non-volatile random access memory (NVRAM), ROM, electrically erasable programmable read-only memory (EEPROM), erasable programmable read-only memory (EPROM), FLASH memory, CD-ROM or other optical disk storage, magnetic disk storage or other magnetic storage devices, or any other tangible medium that can be used to carry or store desired program code in the form of instructions or data structures and that can be accessed by a computer.

The instructions or code associated with a computer-readable medium of the computer program product may be executed by a computer, e.g., by one or more processors, such as one or more digital signal processors (DSPs), general purpose microprocessors, ASICs, FPGAs, or other equivalent integrated or discrete logic circuitry.

A number of aspects and examples have been described. However, various modifications to these examples are possible, and the principles presented herein may be applied to other aspects as well. These and other aspects are within the scope of the following claims.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

The invention claimed is:

1. An apparatus for supplying a voltage to a transmitter circuit, the circuit processing a signal for transmission over a communications channel, the transmitter circuit comprising a mixer for translating a signal to a higher frequency, the transmitter circuit further comprising an amplifier, the apparatus comprising:
a voltage generation module for generating a supply voltage for the transmitter circuit, the supply voltage being at a first level during a first phase, and a second level during a second phase, the first level being higher than the second level, the voltage generation module further generating a second supply voltage for the transmitter circuit, the second supply voltage being at a third level during the first phase, and a fourth level during the second phase.

2. The apparatus of claim 1, the voltage generation module comprising a switched-mode voltage regulator, the switched-mode voltage regulator having an adjustable switching cycle for generating a first level and a second level.

3. The apparatus of claim 1, the voltage generation module comprising at least two voltage regulators, the output of the voltage generation module being selected from the outputs of the at least two voltage regulators by a switch.

4. The apparatus of claim 3, at least one of the two voltage regulators being a buck converter.

5. The apparatus of claim 3, the first phase corresponding to a time during which the transmitter circuit operates in a first mode, and the second phase corresponding to a time during which the transmitter circuit operates in a second mode.

6. The apparatus of claim 5, the first mode being a GSM mode, and the second mode being a W-CDMA mode.

7. The apparatus of claim 6, the level of the supply voltage configured by a control signal supplied to the voltage generation module, the control signal having a first value during the GSM mode, and the control signal having a second value during the W-CDMA mode.

8. The apparatus of claim 3, the level of the supply voltage configured by a control signal supplied to the voltage generation module.

9. The apparatus of claim 1, the supply voltage being supplied to the mixer of the transmitter circuit.

10. The apparatus of claim 1, the amplifier being a variable-gain amplifier, the supply voltage being supplied to the variable-gain amplifier of the transmitter circuit.

11. The apparatus of claim 10, the mixer and variable-gain amplifier being implemented using a stacked topology.

12. The apparatus of claim 1, the amplifier being a power amplifier, the supply voltage supplied to the power amplifier.

13. The apparatus of claim 1, the transmitter circuit further comprising a digital-to-analog converter, the output of the digital-to-analog converter coupled to the input signal of the mixer, the supply voltage being supplied to the digital-to-analog-converter.

14. The apparatus of claim 1, the voltage generation module comprising a plurality of switched-mode voltage regulators, the output of the voltage generation module selected from among the outputs of the plurality of switched-mode voltage generators.

15. An apparatus for supplying a voltage to a transmitter circuit, the circuit processing a signal for transmission over a communications channel, the transmitter circuit comprising a mixer for translating a signal to a higher frequency, the transmitter circuit further comprising an amplifier, the apparatus comprising:

a voltage generation module for generating a supply voltage for the transmitter circuit, the supply voltage being at a first level during a first phase, and a second level during a second phase, the first level being higher than the second level, the supply voltage further being at a third level during a third phase.

16. An apparatus for supplying a voltage to a transmitter circuit, the circuit processing a signal for transmission over a communications channel, the transmitter circuit comprising a mixer for translating a signal to a higher frequency, the transmitter circuit further comprising an amplifier, the apparatus comprising:

a voltage generation module for generating a supply voltage for the transmitter circuit, the supply voltage being at a first level during a first phase, and a second level during a second phase, the first level being higher than the second level, the transmitter circuit coupled to a surface acoustic wave (SAW) filter during the second phase, the transmitter circuit not coupled to the SAW filter during the first phase.

17. The apparatus of claim 16, the amplifier being a variable-gain amplifier, the transmitter circuit further comprising a transformer coupling the output of the variable-gain amplifier to first and second transconductance amplifiers;

the output of the first transconductance amplifier coupled to a first inductor, the first inductor coupled to a first supply voltage; and the output of the second transconductance amplifier coupled to a second inductor, the second inductor coupled to a second supply voltage, the output of the second transconductance amplifier further coupled to the SAW filter.

18. The apparatus of claim 17, the first supply voltage being higher than the second supply voltage, the second transconductance amplifier powered off during the first phase, and the first transconductance amplifier powered on during the second phase.

19. An apparatus for supplying a voltage to a transmitter circuit, the circuit processing a signal for transmission over a communications channel, the transmitter circuit comprising a mixer for translating a signal to a higher frequency, the transmitter circuit further comprising an amplifier, the apparatus comprising:

a voltage generation module for generating a supply voltage for the transmitter circuit, the supply voltage being at a first level during a first phase, and a second level during a second phase, the first level being higher than the second level, the amplifier being a variable-gain amplifier, the transmitter circuit further comprising a transformer coupling the output of the variable-gain amplifier to a transconductance amplifier.

20. A method for supplying a voltage to a transmitter circuit for processing a signal for transmission over a communications channel, the transmitter circuit comprising a mixer for translating a signal to a higher frequency, the transmitter circuit further comprising an amplifier, the method comprising:

generating a supply voltage for the transmitter circuit, the supply voltage being at a first level during a first phase, and a second level during a second phase, the first level being higher than the second level; and generating a second supply voltage for the transmitter circuit, the second supply voltage being at a third level during a first phase, and a fourth level during a second phase.

21. The method of claim 20, the generating the supply voltage performed by a switched-mode voltage regulator.

22. The method of claim 21, the first phase corresponding to a time during which the transmitter circuit operates in a first mode, and the second phase corresponding to a time during which the transmitter circuit operates in a second mode.

23. The method of claim 20, further comprising coupling the signal for transmission to a SAW filter during the second phase, and not coupling the signal for transmission to the SAW filter during the first phase.

* * * * *